US 11,183,659 B2

(12) United States Patent
Liu

(10) Patent No.: US 11,183,659 B2
(45) Date of Patent: Nov. 23, 2021

(54) METHOD OF MANUFACTURING ORGANIC LIGHT-EMITTING DIODE DISPLAY SUBSTRATE, DISPLAY SUBSTRATE AND DISPLAY APPARATUS

(71) Applicant: BOE TECHNOLOGY GROUP CO., LTD., Beijing (CN)

(72) Inventor: Ze Liu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 606 days.

(21) Appl. No.: 16/069,099

(22) PCT Filed: Dec. 15, 2017

(86) PCT No.: PCT/CN2017/116473
§ 371 (c)(1),
(2) Date: Jul. 10, 2018

(87) PCT Pub. No.: WO2018/214484
PCT Pub. Date: Nov. 19, 2018

(65) Prior Publication Data
US 2020/0227672 A1    Jul. 16, 2020

(30) Foreign Application Priority Data

May 26, 2017  (CN) .......................... 201710387570.4

(51) Int. Cl.
*H01L 51/52*    (2006.01)
*H01L 27/32*    (2006.01)
(Continued)

(52) U.S. Cl.
CPC ...... *H01L 51/5228* (2013.01); *H01L 27/3246* (2013.01); *H01L 27/3276* (2013.01);
(Continued)

(58) Field of Classification Search
CPC .. H01L 51/5228; H01L 27/32; H01L 27/3246
See application file for complete search history.

(56) References Cited

U.S. PATENT DOCUMENTS

2007/0102699 A1    5/2007  Lee et al.
2014/0329056 A1    11/2014  Hou et al.
(Continued)

FOREIGN PATENT DOCUMENTS

CN    103137891 A    6/2013
CN    103227190 A    7/2013
(Continued)

OTHER PUBLICATIONS

First Office Action for CN Patent Application No. 201710387570.4 dated May 25, 2020.
(Continued)

*Primary Examiner* — Wasiul Haider
(74) *Attorney, Agent, or Firm* — Dinsmore & Shohl LLP

(57) ABSTRACT

The present disclosure relates to a method of manufacturing an Organic Light-Emitting Diode (OLED) display substrate and the manufactured OLED display substrate. The method comprises: forming an auxiliary electrode and an insulating layer sequentially on a base substrate; forming at least one via in the insulating layer, the via exposing at least a portion of the auxiliary electrode; forming an organic light-emitting layer on the insulating layer; injecting a conductive liquid into the via; curing the conductive liquid and electrically connecting the cured conductive liquid to the auxiliary electrode; and forming a first electrode layer on the organic light-emitting layer, and electrically connecting the first electrode layer to the auxiliary electrode through the cured conductive liquid in the via.

18 Claims, 7 Drawing Sheets

(51) Int. Cl.
  *H01L 51/00* (2006.01)
  *H01L 51/56* (2006.01)
(52) U.S. Cl.
  CPC ...... *H01L 51/0022* (2013.01); *H01L 51/5234*
  (2013.01); *H01L 51/56* (2013.01); *H01L*
  *2227/323* (2013.01)

(56) References Cited

U.S. PATENT DOCUMENTS

| | | | | |
|---|---|---|---|---|
| 2015/0008589 | A1* | 1/2015 | Suzuki | H01L 23/481 |
| | | | | 257/774 |
| 2015/0270192 | A1* | 9/2015 | Bar | H01L 24/17 |
| | | | | 257/706 |
| 2015/0340413 | A1* | 11/2015 | Lee | H01L 51/5209 |
| | | | | 257/40 |
| 2016/0037630 | A1* | 2/2016 | Okamoto | H05K 3/4602 |
| | | | | 361/760 |
| 2016/0095227 | A1* | 3/2016 | Takano | H05K 3/0014 |
| | | | | 156/247 |
| 2016/0126304 | A1 | 5/2016 | Cho et al. | |
| 2016/0211316 | A1* | 7/2016 | Oh | H01L 51/5234 |
| 2016/0343967 | A1 | 11/2016 | Dai et al. | |
| 2016/0343980 | A1* | 11/2016 | Lee | H01L 51/5246 |
| 2017/0033166 | A1* | 2/2017 | Shim | H01L 27/3279 |
| 2017/0125725 | A1* | 5/2017 | Paek | H01L 51/0022 |
| 2017/0133620 | A1* | 5/2017 | Lee | H01L 51/5218 |
| 2017/0141180 | A1* | 5/2017 | Matsumoto | H01L 27/3279 |
| 2018/0108781 | A1 | 4/2018 | Fang et al. | |
| 2018/0331169 | A1* | 11/2018 | Nam | H01L 27/3262 |
| 2019/0287909 | A1* | 9/2019 | Hu | H01L 21/4853 |

FOREIGN PATENT DOCUMENTS

| | | |
|---|---|---|
| CN | 104319352 A | 1/2015 |
| CN | 105449127 A | 3/2016 |
| CN | 104218182 B | 12/2016 |
| EP | 3 166 155 A1 | 5/2017 |

OTHER PUBLICATIONS

International Search Report and Written Opinion for International Appl. No. PCT/CN2017/116473, dated Feb. 26, 2018, 12 pages.
Extended European Search Report dated Jan. 27, 2021, relating to EP Patent Application No. 17889534.8.
Examination Report dated Nov. 26, 2020 relating to Indian Patent Application No. 201837025979.

* cited by examiner

METHOD OF MANUFACTURING ORGANIC LIGHT-EMITTING DIODE DISPLAY SUBSTRATE, DISPLAY SUBSTRATE AND DISPLAY APPARATUS

CROSS REFERENCE TO RELATED APPLICATIONS

The present application claims priority under 35 U.S.C. § 371 to International Patent Application No. PCT/CN2017/116473, filed on Dec. 15, 2017, which claims priority to Chinese Patent Application No. 201710387570.4 filed on May 26, 2017, the disclosure of each of which is hereby incorporated by reference in its entirety.

TECHNICAL FIELD

Embodiments of the present disclosure relate to a field of display technologies, and particularly to a method of manufacturing an Organic Light-Emitting Diode (OLED) display substrate, the manufactured OLED display substrate, and a display apparatus comprising the display substrate.

BACKGROUND

In an OLED display device, the OLED device gradually changes from a bottom emission manner to a top emission manner due to the requirements of increasing a resolution and extending a lifetime of the device. However, an OLED top emission cathode has a high light transmittance, which, however, will cause a cathode material block to have a large resistance and cannot balance problems of a cathode voltage drop (IR drop) and a light transmittance. Accordingly, the voltage drop (IR drop) of electrodes in the OLED device needs to be improved.

SUMMARY

According to one aspect of the present disclosure, a method of manufacturing an OLED display substrate is provided, comprising:
  forming an auxiliary electrode and an insulating layer sequentially on a base substrate;
  forming at least one via in the insulating layer, the via exposing at least a portion of the auxiliary electrode;
  forming an organic light-emitting layer on the insulating layer;
  injecting a conductive liquid into the via;
  curing the conductive liquid and electrically connecting the cured conductive liquid to the auxiliary electrode; and
  forming a first electrode layer on the organic light-emitting layer, and electrically connecting the first electrode layer to the auxiliary electrode through the cured conductive liquid in the via.

According to one embodiment of the present invention, the organic light-emitting layer comprises a portion formed in the via.

According to one embodiment of the present invention, the injecting a conductive liquid into the via comprises: injecting conductive liquid drops into the via by an inkjet printing process to penetrate the organic light-emitting layer.

According to one embodiment of the present invention, the conductive liquid has a temperature of about 50° C. to 300° C.

According to one embodiment of the present invention, the conductive liquid drops have a material of an alloy, and the alloy has a melting point of about 50° C. to 300° C.

According to one embodiment of the present invention, the conductive liquid drops have a material of a solder, and the solder has a melting point of about 50° C. to 300° C.

According to one embodiment of the present invention, a conductive layer is formed on the base substrate, and patterns of the auxiliary electrode and the conductive layer are formed by a one-patterning process.

According to one embodiment of the present invention, the pattern of the conductive layer is one of a gate line pattern, a data line pattern and a pixel electrode pattern.

According to one embodiment of the present invention, the insulating layer comprises a pixel defining layer, and vias for defining pixel units and the via for exposing at least a portion of the auxiliary electrode are formed in the pixel defining layer by the one-patterning process.

According to one embodiment of the present invention, orthographic projections of the vias for defining the pixel units and the via for exposing at least a portion of the auxiliary electrode do not overlap on the base substrate.

According to one embodiment of the present invention, the insulating layer comprises a pixel defining layer and a planarization layer, and the via penetrates the pixel defining layer and the planarization layer.

According to one embodiment of the present invention, the insulating layer comprises a pixel defining layer, a planarization layer, a passivation layer and a gate insulating layer, and the via penetrates the pixel defining layer, the planarization layer, the passivation layer and the gate insulating layer.

According to one embodiment of the present invention, a distribution density of the vias close to a center of the display substrate is greater than that of the vias close to an edge of the display substrate.

According to one embodiment of the present invention, the auxiliary electrode is in a shape of a bar, and is parallel to a gate line or a data line.

According to one embodiment of the present invention, the first electrode layer is a cathode layer.

The second aspect of the present invention provides an OLED display substrate, comprising: a base substrate; an auxiliary electrode on the base substrate; an insulating layer on the auxiliary electrode;
  an organic light-emitting layer on the insulating layer; and
    a first electrode on the organic light-emitting layer, wherein there is at least one via in the insulating layer, and there is a cured conductive element in the via; the auxiliary electrode is electrically connected to the first electrode through the conductive element in the via.

According to one exemplary embodiment of the present invention, a distribution density of the vias close to a center of the display substrate is greater than that of the vias close to an edge of the display substrate.

According to one exemplary embodiment of the present invention, the auxiliary electrode is in a shape of a bar, and is parallel to a gate line or a data line.

According to one exemplary embodiment of the present invention, the first electrode is a cathode.

An embodiment of the third aspect of the present invention provides a display apparatus, comprising the display substrate of respective embodiments of the aforementioned second aspect.

DETAILED DESCRIPTION

Figure 1:
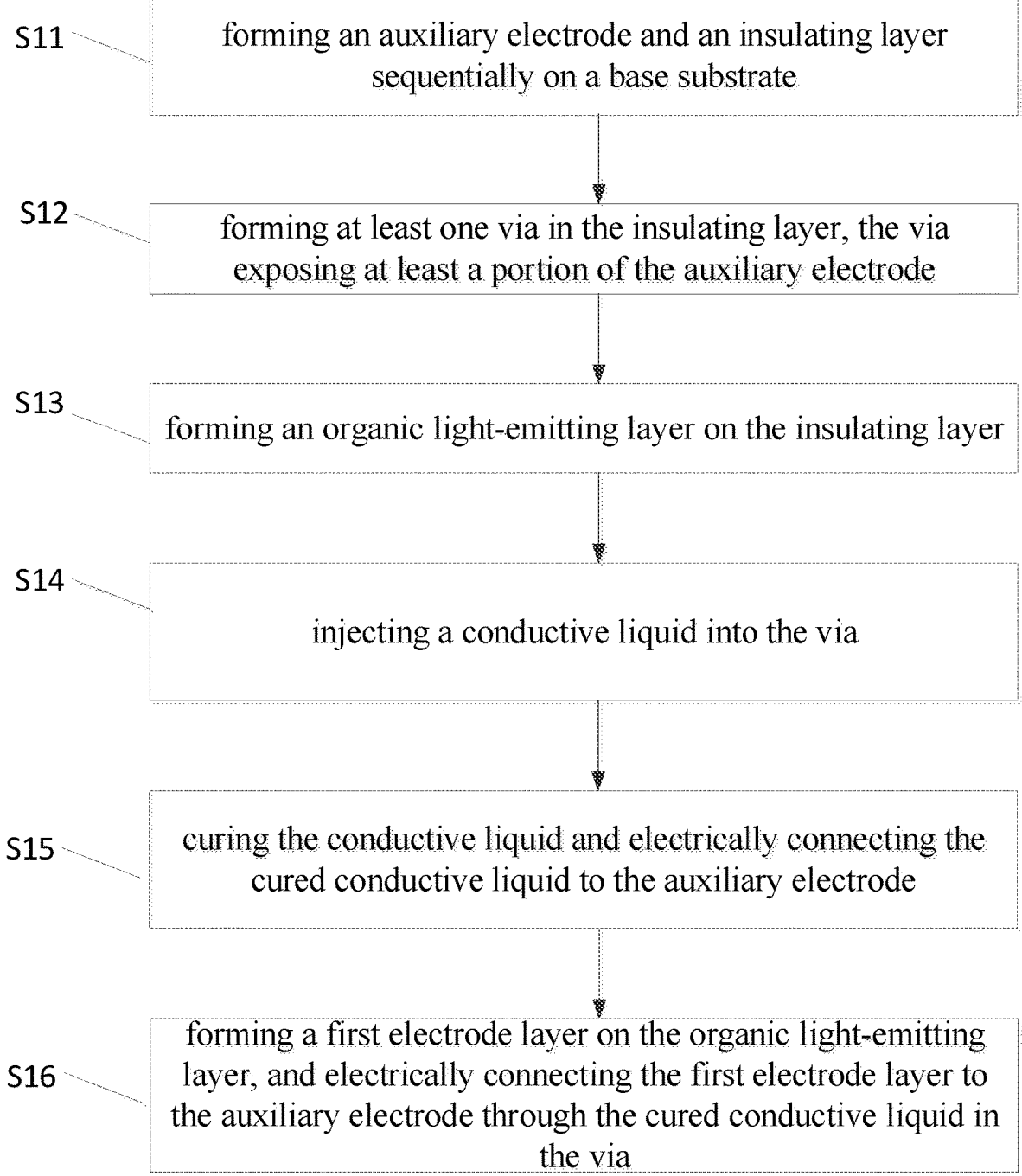
FIG. 1 is a flowchart of a method of manufacturing an OLED display substrate according to one embodiment of the present disclosure.

In order to more clearly illustrate the purpose, technical solutions and advantages of the present disclosure, the embodiments of the present disclosure will be described in detail below with reference to the accompanying drawings. Obviously, the described embodiments are a part of the embodiments of the present disclosure rather than all of the embodiments. It should be understood that the following description of the embodiments is intended to explain and illustrate the general inventive concept of the disclosure and should not be construed as limiting the disclosure. In the description and drawings, the same or similar reference numerals refer to the same or similar parts or components. For clarity, the drawings are not necessarily drawn to scale.

Unless otherwise defined, technical terms or scientific terms used herein have the general meaning as understood by those skilled in the art to which the disclosure belongs. The terms such as "first", "second" or the like used in the disclosure does not indicate any order, quantity or importance, and are merely used to distinguish different components. The terms such as "including", "comprising" or the like means that the presence of an element or item preceding the word encompasses elements or items listed after the word and equivalents thereof, without excluding other elements or items. The terms such as "connecting", "coupling" or the like are not limited to physical or mechanical connections, but may comprise electrical connections, whether directly or indirectly. The terms such as "Up", "Down", "Left", "Right", "Top", "Bottom" or the like are only used to indicate the relative positional relationship. After the absolute position of the described object is changed, the relative positional relationship may also be changed accordingly. When an element such as a layer, a film, a region or a substrate is referred to as being "above" or "under" another element, it can be directly "on" or "below" another element, or there may be intermediate elements.

With respect to the problem existing in the prior art, an embodiment of the present disclosure provides a method of manufacturing an OLED display substrate, which is capable of effectively connecting a cathode layer to an auxiliary electrode through a conductive element, reducing a cathode voltage drop of the top emission OLED display substrate, and facilitating the manufacture of a large-size display screen.

The method of manufacturing the OLED display substrate according to the embodiment of the present disclosure comprises: firstly, forming an auxiliary electrode and an insulating layer having at least one via sequentially on a base substrate, the via exposing at least one portion of the auxiliary electrode; next, forming an organic light-emitting layer on the insulating layer; thereafter, injecting a conductive liquid into the via, curing the conductive liquid and then electrically connecting the cured conductive liquid to the auxiliary electrode; then, forming a cathode layer on the organic light-emitting layer, and electrically connecting the cathode layer to the auxiliary electrode through the cured conductive liquid in the via.

According to the aforementioned method of manufacturing the OLED display substrate, it may effectively reduce a voltage drop of the cathode layer and facilitate the manufacture of a large-size display screen by injecting the conductive liquid into the via above the auxiliary electrode, curing the conductive liquid and then electrically connecting the cured conductive liquid to the auxiliary electrode; then, forming a cathode layer on the organic light-emitting layer, and electrically connecting the cathode layer to the auxiliary electrode through the cured conductive liquid in the via.

In a case where the organic light-emitting layer is manufactured prior to a transparent cathode, the organic light-emitting layer may sometimes preferentially enter the via above the auxiliary electrode before the transparent cathode is manufactured. These organic light-emitting layer materials may prevent the transparent cathode from contacting the auxiliary electrode, which makes it impossible to electrically connect the transparent cathode to the auxiliary electrode. According to some embodiments of the present disclosure, the injected conductive liquid, e.g., a liquid ejected at a high speed or a high-temperature liquid, may damage the organic light-emitting layer in the via above the auxiliary electrode, such that the auxiliary electrode is able to be effectively electrically connected to the cathode.

FIG. 1 is a flowchart of a method of manufacturing the OLED display substrate according to one embodiment of the present disclosure.

As shown in FIG. 1, the method of manufacturing the OLED display substrate according to one embodiment of the present disclosure comprises the following steps:

S11: forming an auxiliary electrode and an insulating layer sequentially on a base substrate.

S12: forming at least one via in the insulating layer, the via exposing at least a portion of the auxiliary electrode.

The base substrate may be made of an alkali glass. The auxiliary electrode may be manufactured on the base substrate by a sputtering process. A material of the auxiliary electrode may be, e.g. various metal materials for manufacturing wires, which comprise but are not limited to, Au, Ag, Cu, Al, Cr, Mo, an alloy or the like. A material of the insulating layer may be, e.g. SiO2, SiN, SiON or a mixed material thereof. According to one example, the insulating layer may be formed on the auxiliary electrode by a chemical vapor deposition process, and the insulating layer may be patterned by a photolithography process to form the via in the insulating layer. According to another example, the via may be formed in the insulating layer by etching the insulating layer with the dry method. The present disclosure makes no limits thereto.

S13: forming an organic light-emitting layer on the insulating layer. The organic light-emitting layer may comprise a hole injection layer, a hole transport layer, an electroluminescent layer, an electron transport layer, an electron injection layer and the like. Materials of the various layers in the organic light-emitting layer may be deposited layer by layer by using a evaporation process.

S14: injecting a conductive liquid into the via.

S15: curing the conductive liquid and electrically connecting the cured conductive liquid to the auxiliary electrode. The conductive liquid is, e.g. a conductive alloy or a solder in a molten state. The conductive liquid directly contacts the auxiliary electrode below the organic light-emitting layer by break downing or damaging the organic light-emitting layer with, e.g. a gravity or a high-temperature, so as to form a conductive connection with the auxiliary electrode.

S16: forming a first electrode layer on the organic light-emitting layer, and electrically connecting the first electrode layer to the auxiliary electrode through the cured conductive liquid in the via. In particular, the first electrode layer is a cathode layer, for example, the cathode layer may be made of a metal oxide material having a high light transmittance, e.g. one or any combination of ITO, IZO, ZnO, InO, IGO and AZO, to which no limits are made by the embodiment of the present disclosure. A cathode material may be deposited above the organic light-emitting layer by the sputtering process or the evaporation process. No limits are made herein.

According to the method of manufacturing the OLED display substrate of the aforementioned embodiment, it may effectively reduce a voltage drop of the cathode layer and facilitate the manufacturing of a large-size display screen by injecting the conductive liquid into the via to penetrate the organic light-emitting layer in the via, and curing the liquid and then electrically connecting the cured liquid to the auxiliary electrode; then, electrically connecting the cathode layer to the auxiliary electrode through the cured conductive liquid.

According to an exemplary embodiment of the present disclosure, in the aforementioned step S14, the injecting a conductive liquid into the via may comprise: ejecting conductive liquid drops into the via by an inkjet printing process. The inkjet printing may be employed to rapidly inject the conductive liquid drops into the via above the auxiliary electrode, and damage the organic light-emitting layer in the via, to achieve a conductive contact of the auxiliary electrode and the cathode. The inkjet printing has advantages such as a simple operation, a low cost, an exact location, a high efficiency, an easily-realized large size and the like.

Those skilled in the art may conceive that, it is also possible to inject the conductive liquid into the via by other method, as long as the conductive liquid can be enabled to penetrate the organic light-emitting layer, thereby implementing an electrical connection of the auxiliary electrode to the cathode above the auxiliary electrode.

According to one embodiment, when the conductive liquid drops are ejected into the via by using the inkjet printing process, the ejected liquid drops have a temperature of above 50° C., e.g. 50° C. to 300° C. A material of the organic light-emitting layer has a melting point of about 50° C. When the ejected liquid drops have a temperature of above 50° C., the material of the organic light-emitting layer may be molten and penetrated, and the conductive liquid drops can directly contact the auxiliary electrode below the organic light-emitting layer. Furthermore, considering the compatibility with the inkjet printing process, the temperature of the ejected liquid drops should be lower than 300° C., such that the inkjet printing can be conveniently implemented.

For example, a material of the liquid drops ejected in the inkjet printing process may be a material of an alloy, e.g. an alloy of Ba, Tin, Pb, In and the like. The alloy has a melting point of, e.g. 50° C. to 300° C., so as to be able to melt the material of the organic light-emitting layer below and to be easy to form the conductive liquid.

According to another embodiment, the material of the liquid drops ejected in the inkjet printing process may be a solder, e.g. a brazing solder, which has a melting point of, e.g. 50° C. to 300° C., so as to be able to melt the organic light-emitting layer material below and to be easy to form the conductive liquid.

FIGS. 2a-2d are schematic diagrams illustrating a principle of the method of manufacturing an OLED display according to one embodiment of the present disclosure.

Figure 2A:
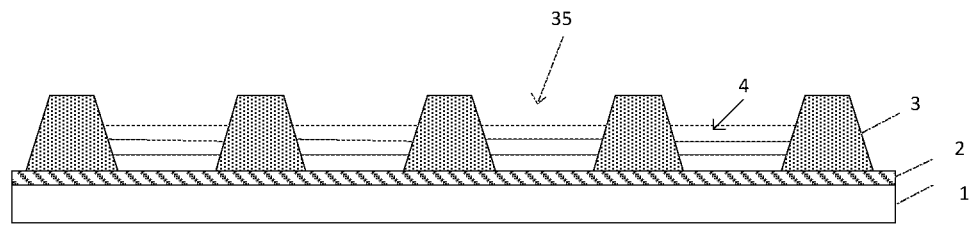
FIGS. 2a-2d are schematic diagrams illustrating a procedure of a method of manufacturing an OLED display according to one embodiment of the present disclosure.

FIG. 2a illustrates a schematic diagram of a sectional structure of the OLED display substrate prior to the inkjet printing. As shown in FIG. 2a, prior to the inkjet printing, the OLED display substrate comprises: a base substrate 1, an auxiliary electrode 2 on the base substrate, and an insulating layer 3 on the auxiliary electrode 2. There is at least one via 35 in the insulating layer 3. The via 35 are filled with the organic light-emitting layer 4. In such a state, when a cathode layer is subsequently deposited, the cathode layer is deposited above the organic light-emitting layer 4 in the via 35. The organic light-emitting layer 4 is nonconductive, and may block an electrical connection of the cathode and the auxiliary electrode 2. Accordingly, the auxiliary electrode 2 cannot serve a function of reducing a voltage drop of the cathode. Therefore, the organic light-emitting layer 4 must be removed from the via 35, such that the auxiliary electrode 2 can be electrically connected to the cathode.

Figure 2B:
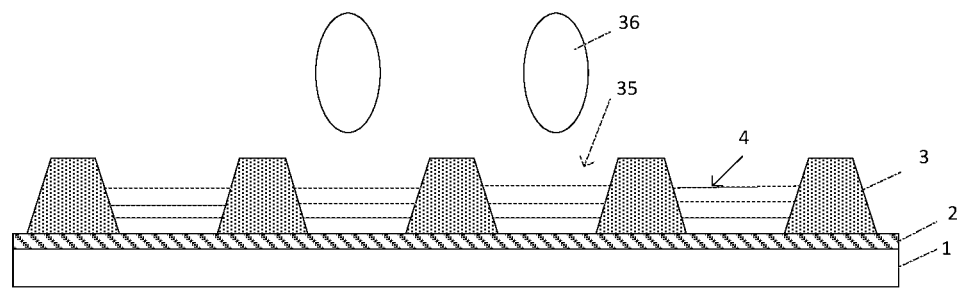

An embodiment of the present disclosure provides a method of removing the organic light-emitting layer 4 rapidly from the via by the inkjet printing. FIG. 2b illustrates a state in which the liquid drops have not yet entered the via 35 above the auxiliary electrode 2 during the inkjet printing process. As shown in FIG. 2b, the conductive liquid drops 36 are ejected into the via 35 by an inkjet printer. The employed inkjet printer is, e.g. a commercial Micro LAB JET 4™ inkjet printer. The conductive liquid drops 36 penetrate the organic light-emitting layer 4 by means of, e.g. a gravity or an ejection impact, to contact the auxiliary electrode 2 below the organic light-emitting layer 4.

Figure 2C:
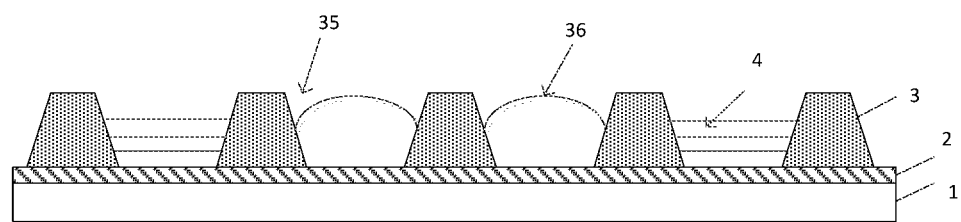

FIG. 2c illustrates a state in which the liquid drops 36 have entered the via 35 and have damaged the organic light-emitting layer 4 so as to directly contact the auxiliary electrode 2. The ejected liquid drops are made of a conductive material. Accordingly, the liquid drops 36 are cured in the via 35 to form an conductive element which electrically contacts the auxiliary electrode 2.

Note that, it is necessary to print the conductive liquid drops 36 only in the via for connecting the auxiliary electrode 2 to the cathode, and it is not necessary to print the the conductive liquid drops 36 in the vias at the remaining locations in the OLED display substrate, e.g. the vias 45 for forming pixels. Furthermore, although FIG. 2c illustrates a state in which the conductive liquid drops 36 replace the organic light-emitting layer in the via 35, it is not necessary to completely remove the organic light-emitting layer 4, as long as the conductive liquid drops break down the organic light-emitting layer 4.

Figure 2D:
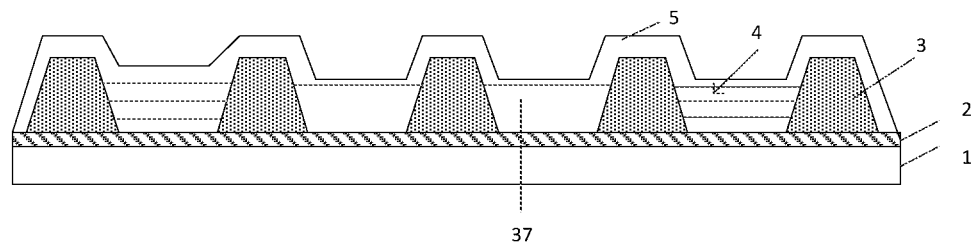

Thereafter, as shown in FIG. 2d, one transparent conductive layer, e.g. an ITO layer, is deposited above the organic light-emitting layer 4 by, e.g. the sputtering process, and is etched to form a cathode 5. At this time, the organic light-emitting layer in the via 35 has been damaged, and has been partially replaced with the conductive element 37. Therefore, the cathode 5 may be electrically connected to the auxiliary electrode 2 through the conductive element 37 in the via 35. The OLED display substrate as manufactured by the aforementioned method effectively connects the cathode layer to the auxiliary electrode through the conductive element, which may effectively reduce a voltage drop of the cathode and facilitate the manufacturing of a large-size display screen.

According to one exemplary embodiment, high-temperature conductive liquid drops may be ejected into the via 35. Because the material of the organic light-emitting layer has a low melting point of, e.g. about 50° C., the high-temperature conductive liquid drops may melt and damage the organic light-emitting layer 4 in the via 35. For example, the liquid drops may have a temperature of above 50° C., e.g. 50° C. to 300° C. Optionally, the liquid drops may have a temperature of 100° C. Optionally, the liquid drops may have a temperature of 50° C. to 100° C., or 100° C. to 300° C.

As an example, a material of the liquid drops as ejected in the inkjet printing process may be a material of an alloy, e.g. an alloy of Ba, Tin, Pb, In and the like. The alloy may selectively have a melting point of, e.g. 50° C. to 300° C., which facilitates melting the material of the organic light-emitting layer, and it is easy for the alloy to form a conductive liquid.

According to another example, a material of the liquid drops as ejected in the inkjet printing process may also be a solder. It is possible to select a solder having a melting point of 50° C. to 300° C., e.g. Tin-Pb solder.

An embodiment of another aspect of the present disclosure further provides an OLED display substrate manufactured by using the aforementioned method. As shown in FIG. 2d, the manufactured OLED display substrate comprises: a base substrate 1; an auxiliary electrode 2 on the base substrate 1; an insulating layer 3 on the auxiliary electrode 2; an organic light-emitting layer 4 on the insulating layer 3; and a cathode 5 on the organic light-emitting layer. There is at least one via 35 for connecting the auxiliary electrode 2 to the cathode 5 in the insulating layer 3. In the via 35, there is a conductive element 37 through which the auxiliary electrode 2 is electrically connected to the cathode 5.

The conductive element 37 is formed by injecting a conductive liquid into the via in the insulating layer 3 and then curing the conductive liquid. During the injection of the conductive liquid, the organic light-emitting layer 4 for connecting the auxiliary cathode 2 to the cathode 5 is damaged, such that the cured conductive liquid directly contacts the auxiliary electrode 2 below the organic light-emitting layer. Thus, the cathode 5 is electrically connected to the auxiliary electrode 2 through the conductive element 37 in the via 35, which achieves a purpose of reducing a voltage drop of the cathode 5 and facilitates the manufacturing of a large-size display screen.

In the aforementioned embodiment, only a portion of the structure of the OLED display substrate is schematically illustrated to explain the embodiment of the present disclosure. In an actual OLED display substrate, the base substrate 1 as shown in FIGS. 2a-2d may be a portion of the structure of an array substrate, e.g. a glass substrate in the array substrate, or any portion of the structure in the array substrate below the conductive layer. The auxiliary electrode 2 may be located in the conductive layer of the array substrate 1. The conductive layer is, e.g. a metal layer.

Specifically, the metal layer may be a metal layer in which a gate line, a data line or a pixel electrode are located. The gate line may be located on the same layer as a gate of a thin film transistor. The data line may be located on the same layer as a source and a drain of the thin film transistor. The pixel electrode may be an anode of the OLED display device. In this way, it is not necessary to add any additional conductive layer or metal layer in the array substrate, which facilitates the reduction of a thickness of the display device and simplifies the structure of the display device. Moreover, the auxiliary electrode may be manufactured while the gate line, the data line or the pixel electrode is manufactured, without adding any additional manufacturing process, such that the manufacturing process is simplified.

When the auxiliary electrode is located in the metal layer in which the gate line is located, the auxiliary electrode and the gate line of the array substrate may be formed by a one-patterning process. The auxiliary electrode and the gate line may be formed by, e.g. using the same metal material which comprises, but is not limited to, for example, Au, Ag, Cu, Al, Cr, Mo, an alloy and the like. No limits are made herein. In this way, the auxiliary electrode may be manufactured while the gate line of the array substrate is manufactured, without adding any additional manufacturing process, such that the manufacturing process is simplified.

Similarly, when the auxiliary electrode is located in the metal layer in which the data line is located, the auxiliary electrode and the data line of the array substrate may be formed by the one-patterning process. The auxiliary electrode and the data line may be formed by, e.g. using the same metal material which comprises, but is not limited to, for example, Au, Ag, Cu, Al, Cr, Mo, an alloy and the like. No limits are made herein. In this way, the auxiliary electrode may be manufactured while the data line of the array substrate is manufactured, without adding any additional manufacturing process, such that the manufacturing process is simplified.

Similarly, when the auxiliary electrode is located in the conductive layer in which the pixel electrode is located, the auxiliary electrode and the pixel electrode of the array substrate may be formed by the one-patterning process. A material of the pixel electrode comprises, but is not limited to, for example, Au, Ag, Cu, Al, Cr, Mo, an alloy and the like, as well as ITO and the like. No limits are made herein. In this way, the auxiliary electrode may be manufactured while the pixel electrode of the array substrate is manufactured, without adding any additional manufacturing process, such that the manufacturing process is simplified.

According to one specific embodiment, the insulating layer above the auxiliary electrode may be a pixel defining layer. At this time, the via for exposing the auxiliary electrode is formed while the vias for defining pixel units are formed in the pixel defining layer. In this way, the vias for defining the pixel units and the via for connecting the auxiliary electrode to the cathode can be manufactured by the same one-patterning process, e.g. the photolithography process, without adding any additional manufacturing process, such that the manufacturing process is simplified.

According to another embodiment, the insulating layer above the auxiliary electrode may be a gate insulating layer and a planarization layer. The gate insulating layer is an insulating layer located above a gate, and the planarization layer is an insulating layer located above the source and the drain of the thin film transistor. At this time, the via for connecting the auxiliary electrode to the cathode needs to penetrate the gate insulating layer and the planarization layer. For example, it is possible to form the gate insulating layer and the planarization layer and then etch the formed gate insulating layer and the planarization layer with the dry method, to integrally form the via for penetrating the two layers.

According to another embodiment, the insulating layer above the auxiliary electrode may be a planarization layer. At this time, the via for connecting the auxiliary electrode to the cathode only needs to penetrate the planarization layer. Therefore, it is possible to form the planarization layer and then etch the formed planarization layer with the dry method to form the via in the planarization layer, so as to connect the auxiliary electrode to the cathode.

Optionally, it is possible to provide one via for connecting the auxiliary electrode to the cathode corresponding to each pixel. Alternatively, it is possible to provide one via for connecting the auxiliary electrode to the cathode corresponding to a plurality of pixels. The vias may be provided in the entire array substrate uniformly or non-uniformly.

For a large-size display panel, since a drive circuit is provided at an edge portion of the array substrate, a cathode voltage drop close to a central portion of the array substrate has a large loss, and a cathode voltage drop at the edge portion of the array substrate has a small loss. Therefore, according to one embodiment, a distribution density of the vias for connecting the auxiliary electrode to the cathode which are close to a center of the array substrate is set to be greater than that of the vias close to the edge of the array substrate. In this way, more auxiliary electrodes are introduced by the vias at the central portion of the array substrate, which can avoid an abnormal pixel display caused by an excessively large loss of the drop voltage at the center of the array substrate.

Figure 3:
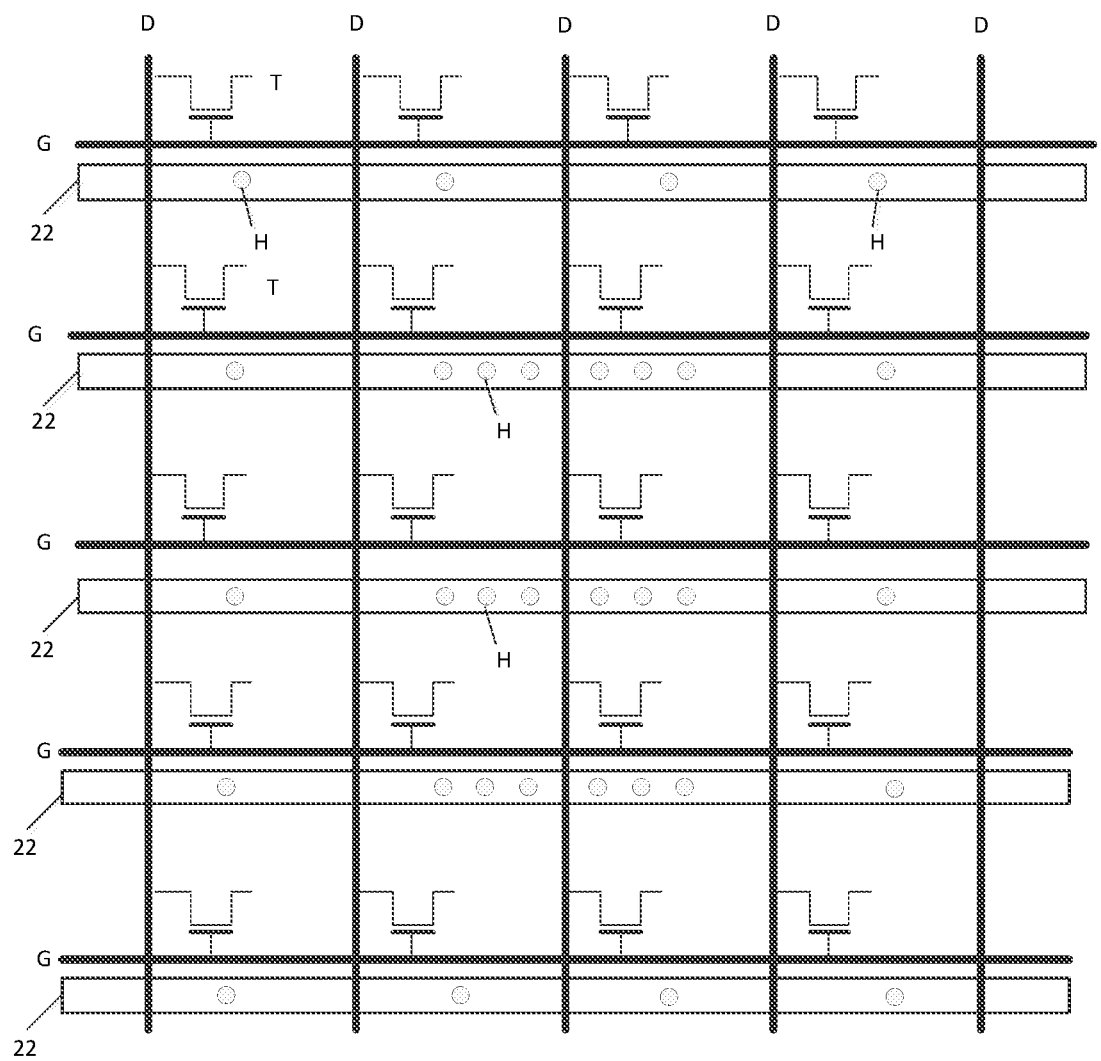
FIG. 3 illustrates a plan schematic diagram of an array substrate according to one embodiment of the present disclosure.

FIG. 3 illustrates a plan schematic diagram of the array substrate according to one embodiment of the present disclosure. In particular, for clarity, only switch transistors T are illustrated, and the other elements for use in the array substrate of the OLED display device which are known in the art, such as drive transistors, capacitors and the like, are not repeatedly described herein. As shown in FIG. 3, for an array substrate comprising 4×4 pixel units, the 2×2 pixel units close to the center of the array substrate may be provided with more vias, and the other pixel units close to the edge of the array substrate may be provided with less vias. Specifically, the number of the vias H for connecting the auxiliary electrode 22 to the cathode in each of the pixel units at row 2, column 2; row 2, column 3; row 3, column 2; and row 3, column 3 close to the center of the array substrate is set as three, and the number of the vias H in the other pixel units close to the edge of the array substrate is set as one.

Alternatively, according to another embodiment, in a partial region close to the center of the array substrate, each of the pixel units is provided with one via, and in a partial region close to the edge of the array substrate, a plurality of pixel units are provided with one via. The closer the vias are to the center of the array substrate, the greater the distribution density of the vias.

According to a specific structure of the display device and a specific location of the auxiliary electrode, the insulating layer may be one or more of a gate insulating layer, a passivation layer, a pixel defining layer and a planarization layer. The vias may be vias which penetrate the respective one or more insulating layers, for electrically connecting the auxiliary electrode to the cathode.

To conveniently manufacture the auxiliary electrode, the auxiliary electrode 22 may be in a shape of a bar, and is parallel to a gate line G or a data line D. FIG. 3 illustrates a case in which the auxiliary electrode 22 is parallel to the gate line G In addition, in order not to affect an opening ratio of pixels, the auxiliary electrode may be formed in gaps between the pixels.

The method of manufacturing the OLED display substrate of the aforementioned embodiment of the present disclosure may be applied to the manufacture of either a top gate OLED display or a bottom gate OLED display. The present disclosure makes no limits thereto.

With reference to FIGS. 4a-4m, an OLED display having a bottom gate structure is taken as an example to explain a specific process of manufacturing the OLED display substrate according to the method of the present disclosure as well as the formed display substrate. Those skilled in the art should understand that, the method of the present disclosure may be also applied to the manufacturing of a bottom gate OLED display.

First of all, a substrate 10 is provided. The substrate 10 may be made of, e.g. an alkali-free glass. The present disclosure makes no limits thereto.

Figure 4A:
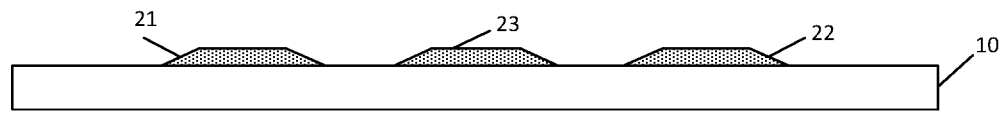
FIGS. 4a-4m are diagrams of a procedure of manufacturing a specific OLED display according to one embodiment of the present disclosure.

Next, a thin film transistor (TFT) is formed on the substrate 10. A bottom gate structure is taken as an example, as shown in FIG. 4a, a first metal layer is deposited above the substrate 10, and the first metal layer is patterned by, e.g. the etching process, to form a gate 21 and an auxiliary electrode 22. For example, a material of the gate metal material layer may be conductive metals such as Mo, Cu and the like. No limits are made herein. A gate line may be formed while the gate 21 and the auxiliary electrode 22 are formed by patterning the first metal layer. That is, by patterning the same metal layer with the same patterning process, the gate 21, the auxiliary electrode 22 and the gate line 23 may be formed at the same time.

It should be noted that, to make the accompanying drawings clearer, the gate line 23 is omitted in the following FIGS. 4b-4m, such that those skilled in the art can understand the embodiments of the present disclosure more easily.

Figure 4B:
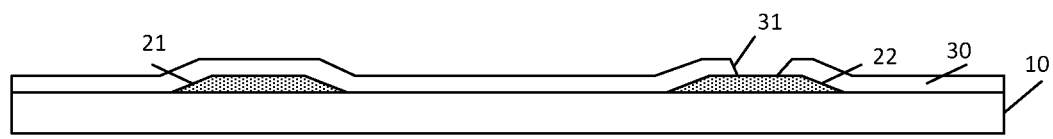

Next, as shown in FIG. 4b, a gate insulating layer 30 is laid above the gate 21 and the auxiliary electrode 22, and the gate insulating layer 30 is patterned by, e.g. the photolithography process, to form a first via 31 in the gate insulating layer 30. The first via 31 is used for connecting the cathode of the OLED display substrate to the auxiliary electrode 22. A material of the gate insulating layer may be, e.g. gate insulating materials in the art, such as SiO, SiON and the like. No limits are made herein.

Figure 4C:
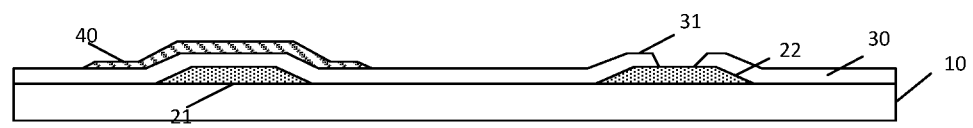

As shown in FIG. 4c, a semiconductor layer is deposited above the gate insulating layer 30 and is patterned to form a semiconductor active layer 40 of the thin film transistor. A material of the semiconductor active layer 40 is, e.g. common materials such as IGZO and the like. No limits are made herein.

Figure 4D:
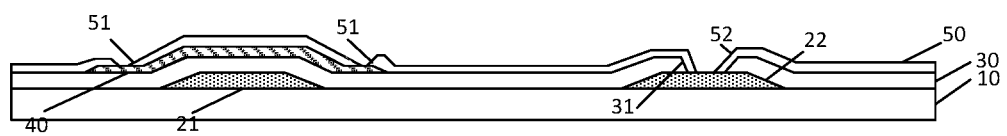

Next, with reference to FIG. 4d, a passivation layer (an etch barrier layer) 50, e.g. an inorganic nonmetal material layer, is deposited above the semiconductor active layer 40, and is patterned by the etching process to form a second via 51 and a third via 52 in the passivation layer 50. The second via 51 is formed at both ends of the semiconductor active layer 40 respectively, for connecting a source and a drain of the thin film transistor. The third via 52 is formed above the auxiliary electrode 22 and is communicated with the first via 31. The third via 52 is also used for connecting the cathode of the OLED display substrate to the auxiliary electrode 22.

Figure 4E:
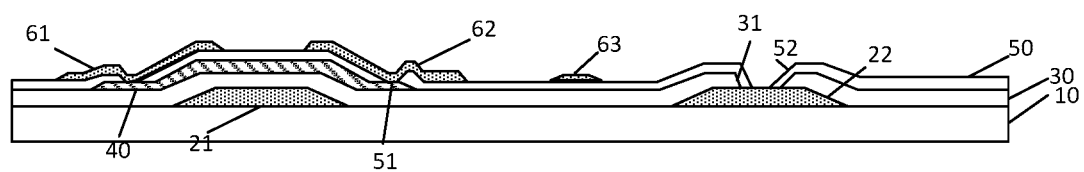

As shown in FIG. 4e, a second metal layer is deposited above the passivation layer 50, and is patterned by, e.g. the etching process, to form a source 61 and a drain 62 of the thin film transistor. A material of the second metal layer may be a source/drain metal material in the art. No limits are made herein. A data line 63 may be formed while the source 61 and the drain 62 are formed by patterning the second metal layer. That is, by patterning the same metal layer with the same patterning process, the source 61, the drain 62 and the data line 63 are formed at the same time.

It should be noted that, to make the accompanying drawings clearer, the data line 63 is omitted in the following FIGS. 4f-4m, such that those skilled in the art can understand the embodiments of the present disclosure more easily.

Figure 4F:
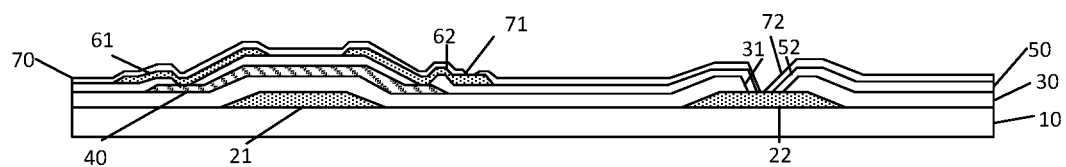

Optionally, as shown in FIG. 4f, a protection layer 70 may be formed above the second metal layer. The protection layer 70 is made of, e.g. an inorganic insulating material, and is patterned by, e.g. the photolithography process, to form a fourth via 71 and a fifth via 72 in the protection layer 70. The fourth via 71 is formed above the drain 62 of the thin film transistor, and the fifth via 72 is formed above the auxiliary electrode 22, which are communicated with the first via 31 and the third via 52. The fourth via 71 is used for connecting a pixel electrode to the drain of the thin film transistor. The fifth via 72 is used for connecting the cathode of the OLED display substrate to the auxiliary electrode 22.

Figure 4G:
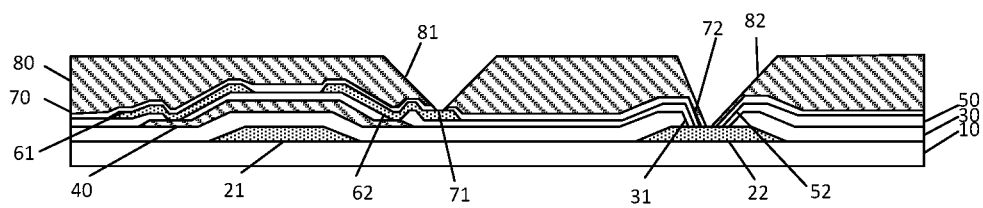

As shown in FIG. 4g, a planarization layer 80 is formed above the protection layer 70. A material of the planarization layer 80 is, e.g. insulating materials for the planarization layer in the art, such as SiO, SiON, SiN and the like. No limits are made herein. The planarization layer 80 is patterned by, e.g. the photolithography process, to form a sixth via 81 and a seventh via 82 in the planarization layer 80. The sixth via 81 is formed above the drain 62 of the thin film transistor, and is communicated with the fourth via 71. The seventh via 82 is formed above the auxiliary electrode 22, and is communicated with the first via 31, the third via 52 and the fifth via 72. The sixth via 81 is used for connecting the pixel electrode to the drain 62 of the thin film transistor, and the seventh via 82 is used for connecting the cathode of the OLED display substrate to the auxiliary electrode 22.

Figure 4H:
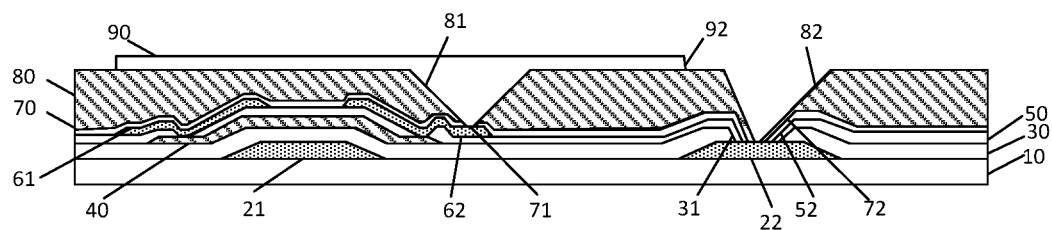

As shown in FIG. 4h, a third metal layer is deposited above the planarization layer 80 by, e.g. the sputtering process, to form a cathode 90 of the OLED display substrate, i.e., a pixel electrode of the array substrate. A material of the third metal layer may be an anode metal material for the OLED display substrate in the art. No limits are made herein. Optionally, the third metal layer may comprise a metal reflective layer and an ITO electrode as necessary. At the seventh via 82, an eighth via 92 which is communicated with the seventh via 82 is also formed in the third metal layer. Because the third metal layer is a conductive layer, it will not affect a electrical connection of the auxiliary electrode 22 to the cathode. In this way, the third metal layer may also enter the seventh via 82, without forming the via 92 in the third metal layer. Alternatively, the third metal layer may partially extend below the pixel electrode layer, but not enter the seventh via 82.

Figure 4I:
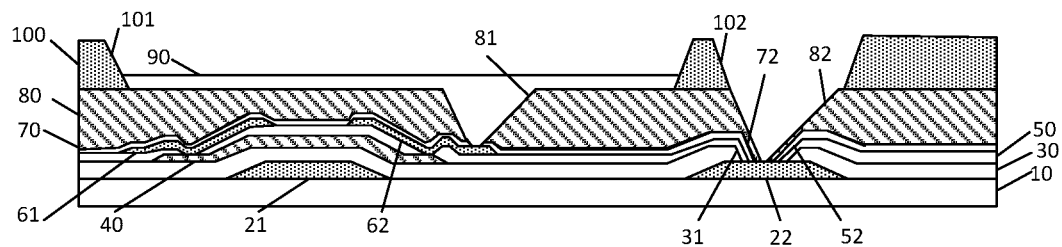

As shown in FIG. 4i, an insulating material layer, e.g. a photoresist layer, is laid above the third metal layer, and the photoresist layer is patterned by, e.g. exposure and development, to form a pixel defining layer 100 in the photoresist layer. Moreover, a ninth via 101 for defining the pixel units and a tenth via 102 for communicating the auxiliary electrode 22 with the cathode are formed in the pixel defining layer 100, and the tenth via 102 is communicated with the eighth via 92. Orthogonal projections of the ninth via 101 and the tenth via 102 on the base substrate do not overlap.

Figure 4J:
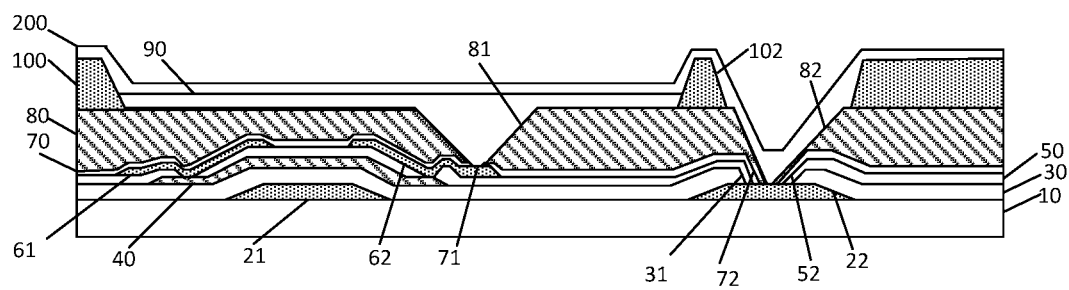

As shown in FIG. 4j, an organic light-emitting layer 200 is deposited above the pixel defining layer 100 by, e.g. the evaporation process. Specifically, the organic light-emitting layer may comprise various layers such as a hole injection layer, a hole transport layer, an electroluminescent layer, an electron transport layer, an electron injection layer and the like. Materials of the various layers of the organic light-emitting layer may be deposited layer by layer by using the evaporation process.

Figure 4K:
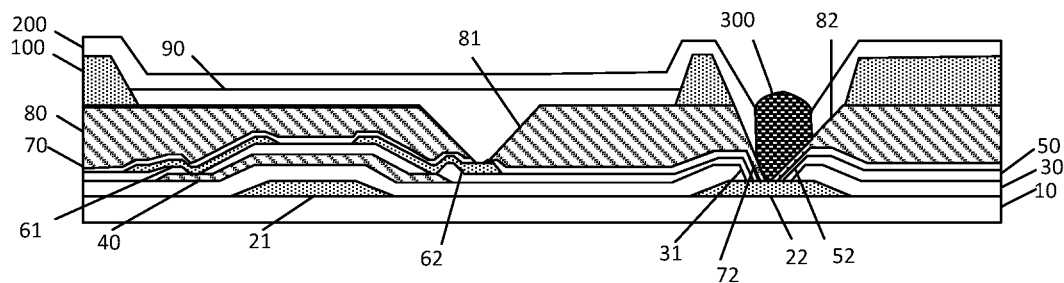

As shown in FIG. 4k, because evaporation is carried out for an entire surface of the organic light-emitting layer, the material of the organic light-emitting layer enters a communication hole formed by the first via 31, the third via 52, the fifth via 72, the seventh via 82, the eighth via 92 and the tenth via 102 and penetrating the gate insulating layer 30, the passivation layer 50, the protection layer 70, the pixel defining layer 80, the anode 90 and the pixel defining layer 100, while entering a pixel region defined by the pixel defining layer 100.

In such a state, when the cathode layer is deposited above the organic light-emitting layer 200 in the following OLED manufacturing process, even if the cathode layer enters the communication hole formed by the first via 31, the third via 52, the fifth via 72, the seventh via 82, the eighth via 92 and the tenth via 102, the communication hole cannot be electrically connected to the auxiliary electrode 22 because it is filled with the organic light-emitting layer 200. Therefore, it is necessary to remove the organic light-emitting layer 200 from the vias above the auxiliary electrode 22, such that the cathode is electrically connected to the auxiliary electrode 22, thereby achieving a purpose of reducing the voltage drop of the cathode and thus enhancing a display quality of the display.

Therefore, according to one embodiment of the present disclosure, the conductive liquid drops are ejected into the via (the communication hole) above the auxiliary electrode 22 by the inkjet printing process, to damage the organic light-emitting layer 200 in the via, such that the cathode can be electrically connected to the auxiliary electrode 22 when the cathode layer is deposited in the following manufacture. Specifically, as shown in FIG. 4k, the high-temperature liquid drops having a temperature of, e.g. 50° C. to 300° C., may be ejected into the via above the auxiliary electrode 22. Optionally, the conductive liquid drops may have a temperature of 100° C. The organic light-emitting layer in the via may be molten and broken down by ejecting the high-temperature conductive liquid drops. Thereafter, the high-temperature conductive liquid drops are cooled and cured to form a conductive element 300.

According to one embodiment, a material of the ejected liquid drops is an alloy, e.g. an alloy material having a melting point of 50° C. to 300° C., e.g. an alloy of Ba, Tin, Pb, In and the like.

According to another embodiment, a material of the ejected liquid drops may be a solder for brazing, e.g. Tin-Pb solder. Alternatively, the solder has a melting point of 50° C. to 300° C., e.g. 100° C.

Figure 4L:
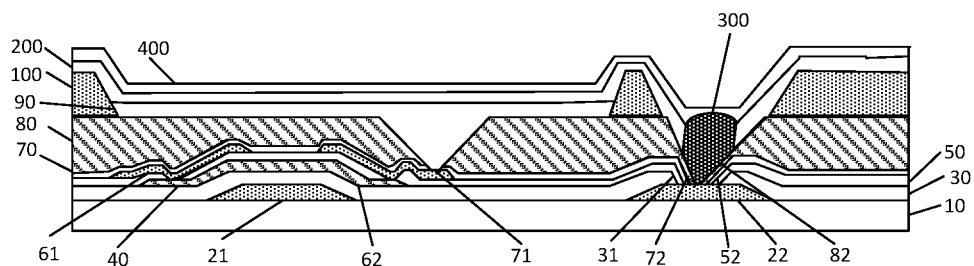

As shown in FIG. 4l, a transparent cathode layer 400 made of a material such as ITO, IZO or the like, is deposited above the organic light-emitting layer 200. At this time, the material of the cathode layer enters a communication hole formed by the first via 31, the third via 52, the fifth via 72, the seventh via 82, the eighth 92 and the tenth via 102 and penetrating the gate insulating layer 30, the passivation layer 50, the protection layer 70, the pixel defining layer 80 and the anode 90, while entering a pixel region defined by the pixel defining layer 80. Since the organic light-emitting layer 200 in the communication hole is penetrated by the high-temperature conductive liquid drops and is replaced with the conductive element 300, the cathode layer 400 may be electrically connected to the auxiliary electrode 22 through the conductive element 300. The connection to the auxiliary electrode may reduce the voltage drop of the cathode, and thus enhance the display quality of the display and facilitate the manufacturing of the large-size display panel.

Figure 4M:
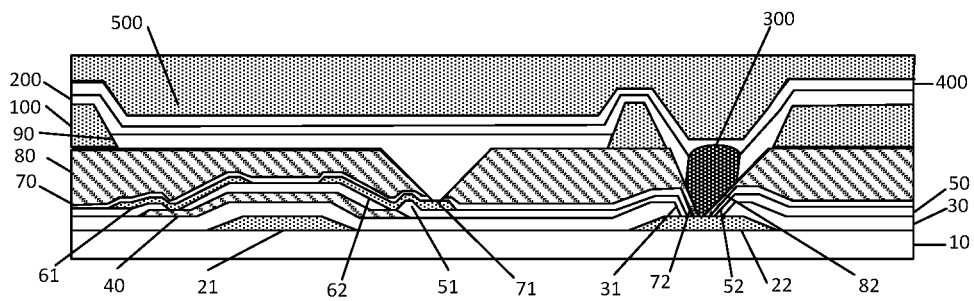

Next, a barrier layer 500 made of an inorganic insulating material may be deposited above the cathode layer 400 by the chemical vapor deposition method or the like to seal the pixel units. The formed array substrate is as shown in FIG. 4m.

Those skilled in the art may understand that, after the aforementioned steps, it is also possible to manufacture a color filter substrate and pair it with the formed array substrate to form an OLED display apparatus.

The method of manufacturing the OLED display substrate according to the aforementioned embodiment comprises injecting a conductive liquid into the via to penetrate the organic light-emitting layer in the via, curing the liquid to form the conductive element which is electrically connected to the auxiliary electrode; then, electrically connecting the cathode layer to the auxiliary electrode through the conductive element formed by curing the conductive liquid. Therefore, it may effectively reduce a voltage drop of the cathode layer, and facilitate the manufacturing of the large-size display screen.

In the aforementioned embodiment, the auxiliary electrode 22 and the gate 21 are formed in the same metal layer, and the auxiliary electrode 22 is electrically connected to the cathode layer 400 through the via which penetrates various insulating layers such as the gate insulating layer 30, the passivation layer 50, the protection layer 70, the planarization layer 80, the pixel defining layer 100 and the like. However, the present disclosure is not limited to this.

According to a modified example of the aforementioned embodiment, the auxiliary electrode 22 may be formed in the same metal layer as the source 61 and the drain 62. When the auxiliary electrode 22 is formed in the same metal layer as the source 61 and the drain 62, the via for communicating the cathode 400 with the auxiliary electrode 22 may penetrate only the protection layer 70, the planarization layer 80 and the pixel defining layer 100, without penetrating the gate insulating layer 30 and the passivation layer 50.

According to another modified example of the aforementioned embodiment, the auxiliary electrode 22 may be formed in the same layer as the anode 90 which is the pixel electrode. When the auxiliary electrode 22 and the anode 90 are formed in the same layer, the via for communicating the cathode 400 with the auxiliary electrode 22 may penetrate only the pixel defining layer 100, without penetrating the gate insulating layer 30, the passivation layer 50, the protection layer 70 and the planarization layer 80.

Therefore, the auxiliary electrode may be formed in any of the conductive layers in the array substrate, either a metal conductive layer or a nonmetal conductive layer, to which the present disclosure makes no limits. In this way, the auxiliary electrode may be manufactured while the conductive layer of the array substrate is manufactured, without adding any additional manufacturing process, such that the manufacturing process is simplified.

In addition, in the aforementioned embodiment, some layers may be omitted, for example, the protection layer 70 may be omitted as necessary. Alternatively, another layer may be further added as necessary, as long as the auxiliary electrode may be electrically connected to the cathode through the via penetrating the insulating layer. Therefore, the drawings accompanying of the embodiments of the present disclosure only relate to the structures involved by the embodiments of the present disclosure, and the other structures may refer to common designs.

Furthermore, the via for communicating the auxiliary electrode 22 with the cathode layer 400 is formed in a manner of layer-by-layer in the aforementioned embodiment. However, the present disclosure is not limited to this. For example, when the gate insulating layer 30, the passivation layer 50, the protection layer 70, the planarization layer 80 and the pixel defining layer 100 are manufactured, it is not necessary to form a via at a location above the auxiliary electrode 22 in advance, and a via which penetrates the pixel defining layer 100, the planarization layer 80, the protection layer 70, the passivation layer 50 and the gate insulating layer 30 from top to bottom is integrally formed by the etching process, after the manufacturing of the gate insulating layer 30, the passivation layer 50, the protection layer 70, the planarization layer 80 and the pixel defining layer 100 is completed.

Furthermore, the OLED display substrate having a bottom gate structure is taken as an example above to explain a specific process of manufacturing the OLED display substrate. However, those skilled in the art should understand that, the conception of the present disclosure may be also used for an OLED display substrate having a bottom gate substrate or an OLED display substrate having a double gate structure, to which the present disclosure makes no limits.

Another aspect of the present invention provides an OLED display substrate, comprising: a base substrate 1; an auxiliary electrode 22 on the base substrate 1; an insulating layer 30 on the auxiliary electrode 22; an organic light-emitting layer 4 on the insulating layer 30; and a first electrode 5 on the organic light-emitting layer 4, wherein there is at least one via 35 in the insulating layer 30, and there is a cured conductive element 36 in the via; the auxiliary electrode 22 is electrically connected to the first electrode 5 through the conductive element 36 in the via 35. Since the conductive element 36 is formed by curing a liquid conductive material which may be specifically a high-temperature conductive liquid in this case, when the liquid conductive material enters the via, the organic light-emitting layer in the via may be molten and penetrated due to the high temperature of the liquid conductive material. In this way, it is convenient to electrically connect the first electrode through the conductive element 36 in the via 35, so as to reduce a voltage drop over the first electrode.

Another embodiment of the present invention further relates to a display device comprising the display substrate as manufactured according to the foregoing embodiment. The display device may be, for example, a device having a display function, such as a mobile phone, a television set, a tablet computer, a notebook computer, a digital photo frame, a personal digital assistant, a navigator or the like.

Several embodiments of the present disclosure have been described above by way of example, but those skilled in the art will recognize that various modifications and changes may be made to the embodiments of the present disclosure without departing from the concepts of the present disclosure. All of such modifications and variations should fall within the scope of the disclosure. Therefore, the protection scope of the present disclosure should be based on the protection scope defined by the claims.

What is claimed is:

1. A method of manufacturing an Organic Light-Emitting Diode (OLED) display substrate, comprising:
    forming an auxiliary electrode and an insulating layer sequentially on a base substrate;
    forming at least one via in the insulating layer, the via exposing at least a portion of the auxiliary electrode;
    forming an organic light-emitting layer on the insulating layer;
    injecting a conductive liquid into the via;
    curing the conductive liquid and electrically connecting the cured conductive liquid to the auxiliary electrode; and forming a first electrode layer on the organic light-emitting layer, and electrically connecting the first electrode layer to the auxiliary electrode through the cured conductive liquid in the via, wherein the insulating layer comprises a pixel defining layer, a planarization layer, a passivation layer and a gate insulating layer, and the via penetrates the pixel defining layer, the planarization layer, the passivation layer and the gate insulating layer.

2. The method according to claim 1, wherein a portion of the organic light-emitting layer is formed in the via.

3. The method according to claim 2, wherein injecting the conductive liquid into the via comprises: injecting conductive liquid drops into the via by an inkjet printing process to penetrate the portion of the organic light-emitting layer in the via.

4. The method according to claim 3, wherein the conductive liquid drops have a material of an alloy, and the alloy has a melting point of about 50° C. to 300° C.

5. The method according to claim 3, wherein the conductive liquid drops have a material of a solder, and the solder has a melting point of about 50° C. to 300° C.

6. The method according to claim 1, wherein the conductive liquid has a temperature of about 50° C. to 300° C.

7. The method according to claim 1, wherein a conductive layer is formed on the base substrate, and patterns of the auxiliary electrode and the conductive layer are formed by a one-patterning process.

8. The method according to claim 7, wherein the pattern of the conductive layer is one of a gate line pattern, a data line pattern or a pixel electrode pattern.

9. The method according to claim 1, wherein vias for defining pixel units and the via for exposing at least a portion of the auxiliary electrode are formed in the pixel defining layer by a one-patterning process.

10. The method according to claim 9, wherein orthographic projections of the vias for defining the pixel units and the via for exposing at least a portion of the auxiliary electrode do not overlap on the base substrate.

11. The method according to claim 1, wherein a distribution density of the vias on the auxiliary electrodes close to a center of the display substrate is greater than that of the vias on the auxiliary electrodes close to an edge of the display substrate.

12. The method according to claim 1, wherein the auxiliary electrode is in a shape of a bar, and is parallel to a gate line or a data line.

13. The method according to claim 1, wherein the first electrode layer is a cathode layer.

14. An Organic Light-Emitting Diode (OLED) display substrate, comprising:
a base substrate;
an auxiliary electrode on the base substrate;
an insulating layer on the auxiliary electrode;
an organic light-emitting layer on the insulating layer; and
a first electrode on the organic light-emitting layer,
wherein at least one via is formed in the insulating layer, a cured conductive element is provided in the via; the auxiliary electrode is electrically connected to the first electrode through the conductive element in the via, the insulating layer comprises a pixel defining layer, a planarization layer, a passivation layer and a gate insulating layer, and the via penetrates the pixel defining layer, the planarization layer, the passivation layer and the gate insulating layer.

15. The OLED display substrate according to claim 14, wherein a distribution density of the vias on the auxiliary electrodes close to a center of the display substrate is greater than that of the vias on the auxiliary electrodes close to an edge of the display substrate.

16. The OLED display substrate according to claim 14, wherein the auxiliary electrode is in a shape of a bar, and is parallel to a gate line or a data line.

17. The OLED display substrate according to claim 14, wherein the first electrode is a cathode.

18. A display apparatus, comprising the OLED display substrate according to claim 14.

* * * * *